(12) United States Patent
Wu (10) Patent No.: US 10,497,899 B2
(45) Date of Patent: Dec. 3, 2019

(54) HARDENING FILM AND METHOD OF MANUFACTURING THE SAME, FLEXIBLE AMOLED DISPLAY DEVICE

(71) Applicant: WUHAN CHINA STAR OPTOELECTRONICS TECHNOLOGY CO., LTD., Wuhan, Hubei (CN)

(72) Inventor: Jia-Shu Wu, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/572,022

(22) PCT Filed: Aug. 11, 2017

(86) PCT No.: PCT/CN2017/097190
§ 371 (c)(1),
(2) Date: Nov. 6, 2017

(87) PCT Pub. No.: WO2019/014994
PCT Pub. Date: Jan. 24, 2019

(65) Prior Publication Data
US 2019/0019986 A1    Jan. 17, 2019

(30) Foreign Application Priority Data
Jul. 17, 2017 (CN) .......................... 2017 1 0581900

(51) Int. Cl.
*H01L 51/52* (2006.01)
*G03F 7/00* (2006.01)
(Continued)

(52) U.S. Cl.
CPC ........ *H01L 51/5253* (2013.01); *G03F 7/0007* (2013.01); *H01L 51/0097* (2013.01);
(Continued)

(58) Field of Classification Search
None
See application file for complete search history.

(56) References Cited

U.S. PATENT DOCUMENTS

| 8,920,889 | B2* | 12/2014 | Yoneyama | ........... | G02B 5/3025 |
| | | | | | 349/117 |
| 9,688,051 | B2 | 6/2017 | Min et al. | | |
| 2014/0110725 | A1 | 4/2014 | Lee | | |

FOREIGN PATENT DOCUMENTS

| CN | 102279425 A | 12/2011 |
| CN | 102854743 A | 1/2013 |

(Continued)

*Primary Examiner* — Fernando L Toledo
*Assistant Examiner* — Valerie N Newton
(74) *Attorney, Agent, or Firm* — Mintz Levin Cohn Ferris Glovsky and Popeo, P.C.; Jhongwoo Peck (57) ABSTRACT

The present disclosure discloses a hardening film which includes a substrate film layer and a hardening film layer on the substrate film layer, wherein a micro stereo structure layer including a plurality of micro stereo structures is disposed between the substrate film layer and the hardening film layer. A method of manufacturing the abovementioned hardening film includes: providing a substrate film layer; forming a micro stereo structure layer on the substrate film layer using a printing process or a photolithography process; and forming a hardening film layer on the micro stereo structure layer. The present disclosure also discloses a flexible AMOLED display device containing the abovementioned hardening film.

6 Claims, 10 Drawing Sheets

(51) Int. Cl.
    *H01L 51/00*     (2006.01)
    *H01L 27/32*     (2006.01)

(52) U.S. Cl.
    CPC ...... *H01L 51/5237* (2013.01); *H01L 27/3244* (2013.01); *H01L 2251/5338* (2013.01)

(56) References Cited

FOREIGN PATENT DOCUMENTS

| | | | |
|---|---|---|---|
| CN | 103660486 | A | 3/2014 |
| CN | 203462681 | U | 3/2014 |
| CN | 104871089 | A | 8/2015 |
| CN | 104966790 | A | 10/2015 |
| CN | 106095153 | A | 11/2016 |
| CN | 106449711 | A | 2/2017 |
| CN | 206297200 | U | 7/2017 |
| CN | 107081951 | A | 8/2017 |
| JP | 2014205279 | A | 10/2014 |
| WO | 2016179778 | A1 | 11/2016 |

\* cited by examiner

HARDENING FILM AND METHOD OF MANUFACTURING THE SAME, FLEXIBLE AMOLED DISPLAY DEVICE

CROSS-REFERENCES TO RELATED APPLICATIONS

This application is a U.S. national phase application, pursuant to 35 U.S.C. § 371, of PCT/CN2017/097190, filed Aug. 11, 2017, designating the United States, which claims priority to Chinese Application No. 201710581900.3, filed Jul. 17, 2017. The entire contents of the aforementioned patent applications are incorporated herein by this reference.

TECHNICAL FIELD

The present invention relates to the display technical field, especially to a hardening film and a method of manufacturing the same, and also relates to a flexible AMOLED display device including the hardening film.

BACKGROUND ART

An Organic Light Emitting Diode (OLED) has a self-luminous characteristic and uses a very thin organic material coating layer and a glass substrate, when current passes through, the organic material may emit light, and the organic light emitting diode display screen has a large viewing angle and can save electric energy remarkably, thus recently, the organic light emitting diode is used more and more extensively. The drive mode of OLED is divided into passive drive mode and active drive mode. The OLED of passive drive mode is a Passive Matrix Organic Light Emitting Diode (PMOLED), and the OLED of active drive mode is an Active Matrix Organic Light Emitting Diode (AMOLED). Since it is difficult to make the PMOLED with a large size, to maintain brightness of a whole panel, the operating current needs to be raised to enhance the brightness of each pixel, which reduces its service life, and with the current applications, the AMOLED has become more and more popular. Compared to the typical liquid crystal panel, the AMOLED has characteristics, such as rapid reaction, high contrast and wide viewing angle and so on. In addition, the AMOLED also has a self-luminous characteristic and does not need a backlight plate, thus it is lighter and thinner than the typical liquid crystal panel and can also save cost of a backlight module. Therefore, the AMOLED has good application prospect for having advantages in various aspects.

An AMOLED display device generally includes a thin film transistor (TFT) array substrate, an organic light emitting structure layer disposed on the array substrate, and a protective cover plate disposed on the organic light emitting structure layer. The organic light emitting structure layer includes an anode, an organic light emitting layer and a cathode sequentially disposed on the array substrate, and the protective cover plate generally uses a toughened glass.

One feature of the AMOLED display device is flexible display, and a transformable and bendable flexible display device can bring a revolutionary experience for customers. In a flexible AMOLED display device, a substrate in the TFT array substrate uses a flexible substrate, while the protective cover plate uses a hardening film instead of the toughened glass, so as to satisfy the requirement of the bendable performance of the product.

At present, the hardening film applied to the flexible AMOLED display device is primarily formed by coating a hardening layer with hardness characteristics on a flexible substrate. The hardening film with such a structure can satisfy the requirement of the bendable performance of the product, but its anti-impact ability is poor, as a result, an overall surface hardness of the flexible AMOLED display device reduces, thereby lowering quality of the product.

SUMMARY

With a view to the shortcomings of the prior art, the present disclosure provides a hardening film, and an application of it in a flexible AMOLED display device enhances the anti-impact ability of the product, increases an overall surface hardness of the flexible display device, and promotes the quality of the product, while satisfy the requirement of the bendable performance of the product.

In order to achieve the above purpose, the present disclosure adopts the following technical solutions:

a hardening film includes a substrate film layer and a hardening film layer on the substrate film layer, wherein a micro stereo structure layer including a plurality of micro stereo structures is disposed between the substrate film layer and the hardening film layer.

The micro stereo structure is a hollow or a solid stereo structure having a section of a polygonal, a circular, an elliptical or an irregular shape.

A thickness of the micro stereo structure layer is 1-5 μm.

A material of the micro stereo structure layer is an optical resin.

A thickness of the substrate film layer is 10-250 μm, and a thickness of the hardening film layer is 10-100 μm.

The present disclosure further provides a method of manufacturing the abovementioned hardening film, which includes: providing a substrate film layer; forming a micro stereo structure layer including a plurality of micro stereo structures on the substrate film layer using a printing process or a photolithography process; and forming a hardening film layer on the micro stereo structure layer.

Another aspect of the present disclosure provides a flexible AMOLED display device which includes a flexible TFT array substrate and an organic electroluminescence structure layer disposed on the flexible TFT array substrate, wherein the organic electroluminescence structure layer is also disposed with the abovementioned hardening film.

Compared with the prior art, the hardening film provided in an embodiment of the present disclosure can maintain a good bending performance by disposing a micro stereo structure layer, in which a plurality of micro stereo structure are disposed, between the substrate film layer and the hardening film layer, so that micro stereo structure layer forms a pore shape between the substrate film layer and the hardening film layer, and an application of the hardening film in the flexible AMOLED display device definitely can satisfy the requirement of the bendable performance of the product. In addition, when being subjected to an external pressure, the micro stereo structures can scatter and transfer a pressure of depressing the hardening film layer towards respective directions, which enhances the anti-impact ability of the product, increases an overall surface hardness of the flexible display device and promotes the quality of the product.

DETAILED DESCRIPTION OF EXEMPLARY EMBODIMENTS

In order for the purpose, technical solution and advantages of the present disclosure to be clearer, the embodiments of the present disclosure will be explained in detail below in conjunction with the drawings. These preferred embodiments are exemplified in the drawings. The embodiments of the present disclosure as shown in the drawings and as described according to the drawings are only exemplified, and the present disclosure is not limited to these embodiments.

Here, it is also worthy to note that, in order to prevent the present disclosure from being obscured due to unnecessary details, the drawings only illustrate the structure and/or processing steps closely related to the solution according to the present disclosure, while other details less related to the present disclosure are omitted.

Figure 1:
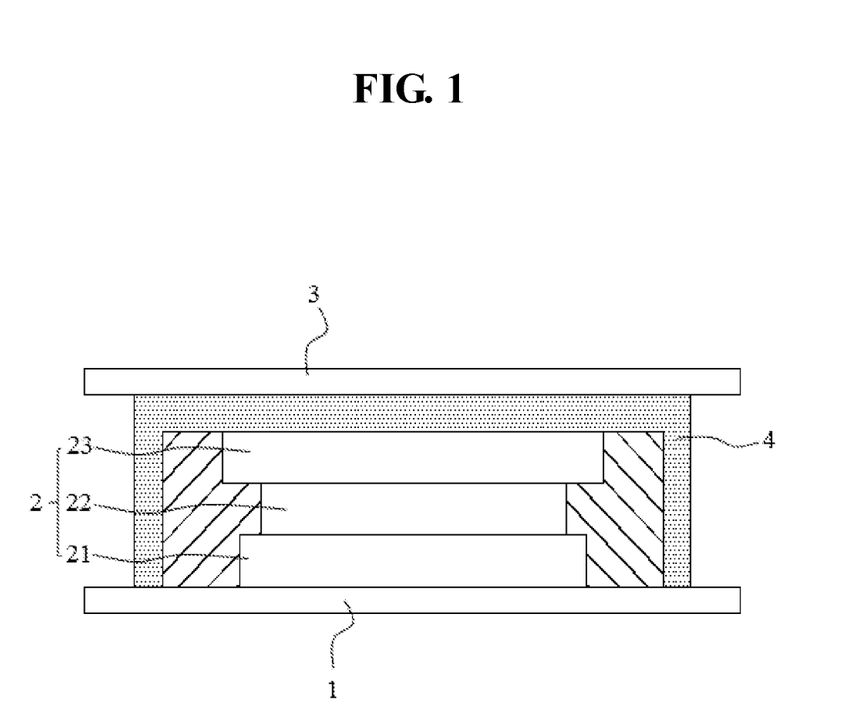
FIG. 1 is a structural diagram of a flexible AMOLED display device provided by an embodiment of the present disclosure.

The present embodiment first provides a flexible AMOLED display device, as shown in FIG. 1, the AMOLED display device includes an array substrate 1 and an organic electroluminescence structure layer 2 disposed on the array substrate 1. The array substrate 1 is a thin film transistor (TFT) array substrate and includes a flexible substrate and a thin film transistor formed on the flexible substrate. The organic electroluminescence structure layer 2, containing a plurality of organic electroluminescence pixel structures, includes an anode 21, an organic light emitting layer 22 and a cathode 23 sequentially disposed on the array substrate 1. A hardening film 3 is disposed on organic electroluminescence structure layer 2 and serves to protect the organic electroluminescence structure layer 2 and other components on the array substrate 1. The hardening film 3 has a bendable characteristic, so as to satisfy the requirement of the bendable performance of the flexible AMOLED display device. Furthermore, as shown in FIG. 1, an encapsulation thin film layer 4 is further disposed below the hardening film 3, and the encapsulation thin film layer 3 serves to encapsulate the organic electroluminescence structure layer 2 on the array substrate 1 and play the role of waterproof and dustproof.

Figure 2:
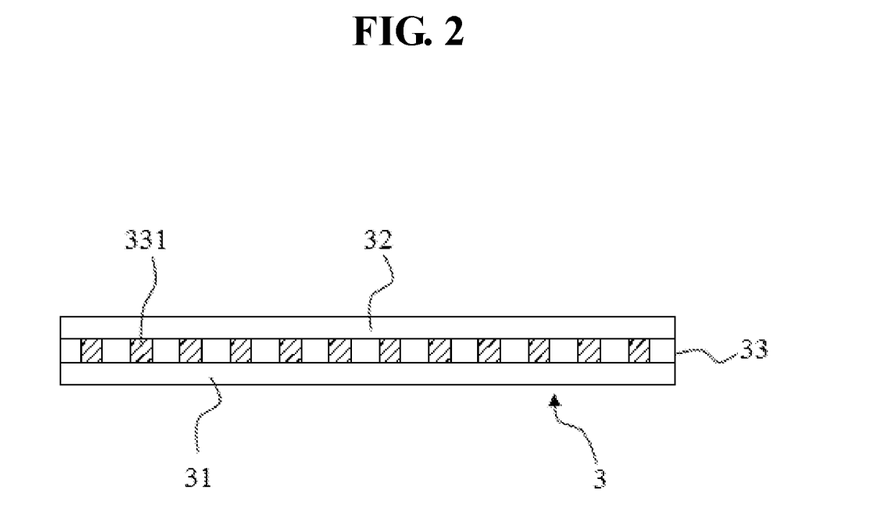
FIG. 2 is a structure diagram of a hardening film provided by an embodiment of the present invention.

The embodiment provides a hardening film 3, and the hardening film 3 increase an overall surface hardness of the flexible display device while satisfy the requirement of the bendable performance of the product.

As shown in FIG. 2, the hardening film includes a substrate film layer 31 and a hardening film layer 32 on the substrate film layer 31, and a micro stereo structure layer 33 including a plurality of micro stereo structures 331 is further provided between the substrate film layer 31 and the hardening film layer 32. Materials of the substrate film layer 31 and the hardening film layer 32 may use materials which are used for forming the hardening film and have already been disclosed in the prior art, for example, a material of the substrate film layer usually select polyethylene terephthalate (PET), triacetyl cellulose (TAC) or polyimide (PI), and may also use polymethyl methacrylate (PMMA). A material of the hardening film layer usually select a composition having a photohardening characteristic.

In the present embodiment, the micro stereo structure layer 33, in which a plurality of micro stereo structures 331 are disposed, is disposed between the substrate film layer 31 and the hardening film layer 32, thus when being subjected to an external pressure, the micro stereo structures 331 can scatter and transfer a pressure of depressing the hardening film layer 32 towards respective directions, which enhances the anti-impact ability of the product, thus achieves the purpose of increasing an overall surface hardness of the flexible display device, and promotes the quality of the product.

Figure 3A:
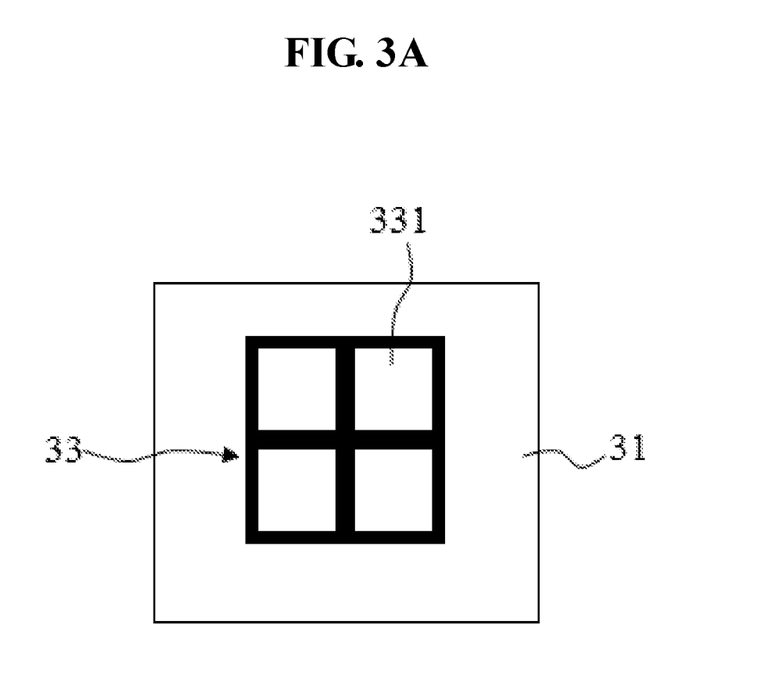
FIGS. 3A-3H are structural diagrams of micro stereo structures located on a substrate film layer in an embodiment of the present disclosure.
Figure 3B:
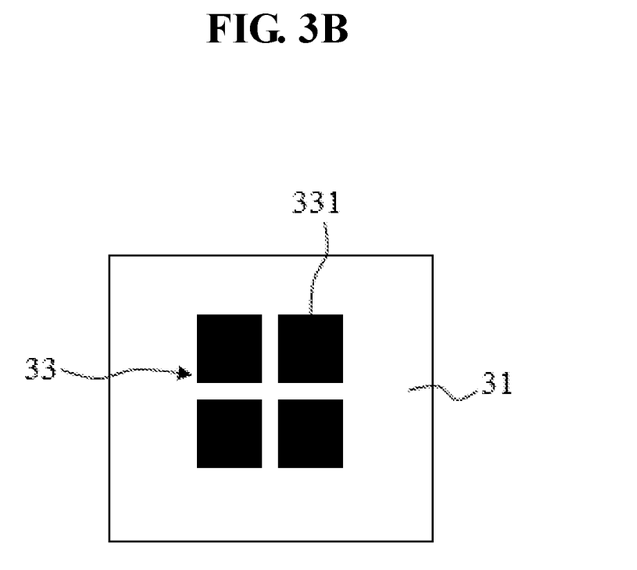
Figure 3C:
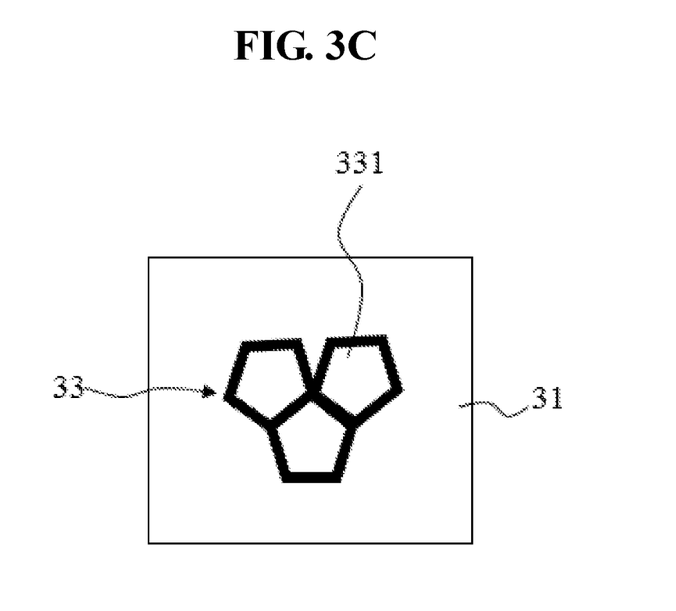
Figure 3D:
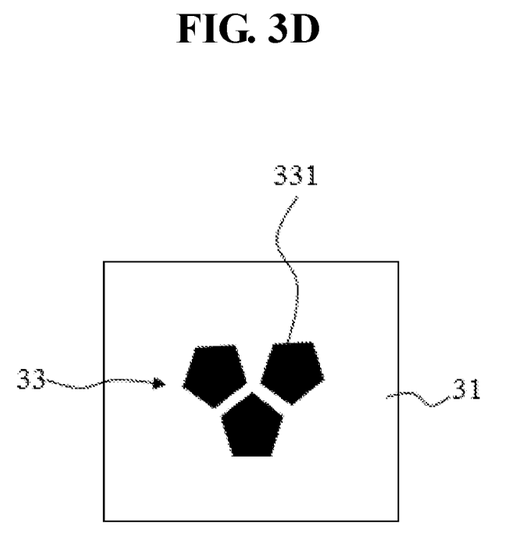
Figure 3E:
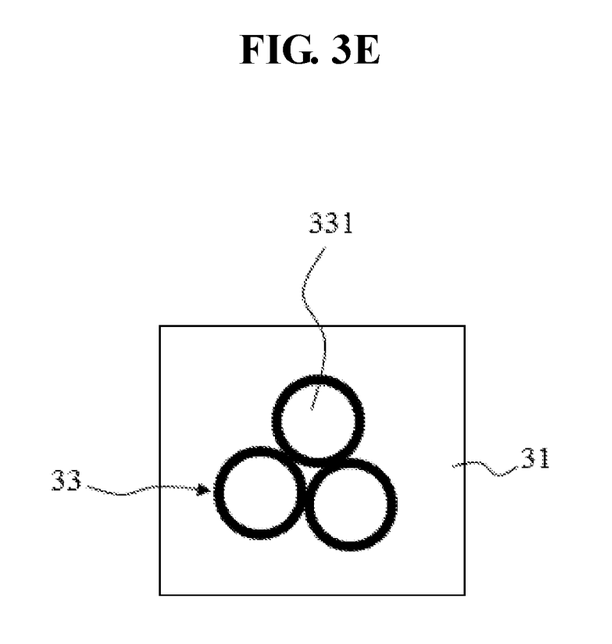
Figure 3F:
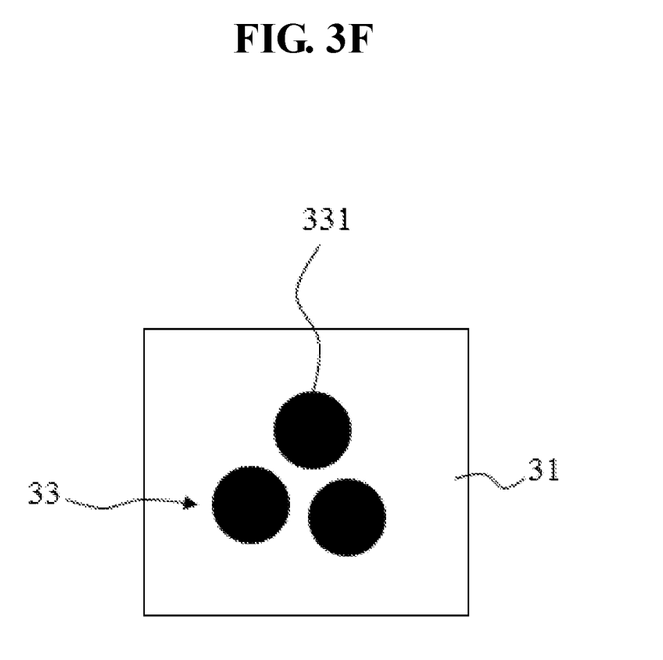
Figure 3G:
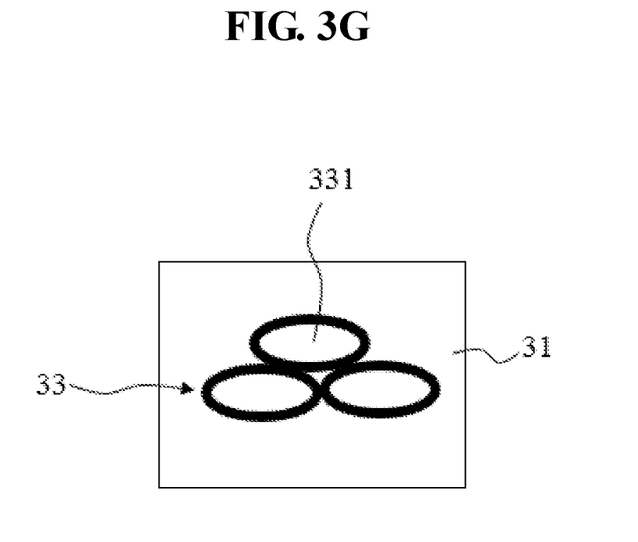
Figure 3H:
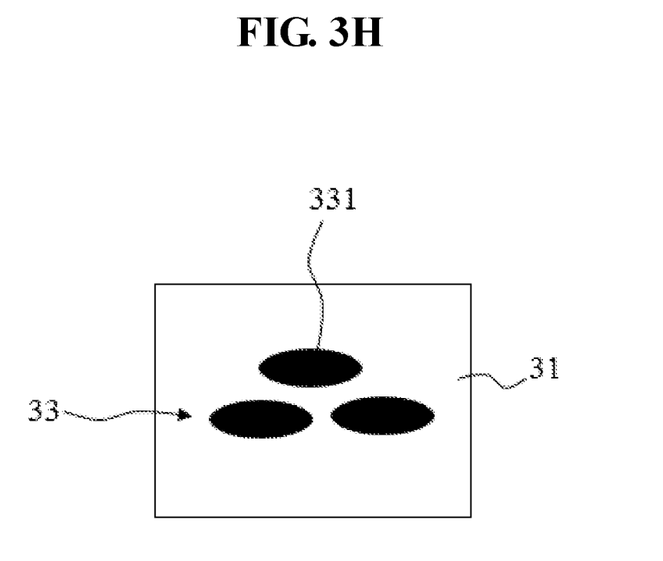

A material of the micro stereo structure layer 33 is an optical resin, and more specific, can select a UV resin. FIGS. 3a-3h are structural diagrams illustrating some detailed embodiments of the micro stereo structure layer 33 located on the substrate film layer 31. Particularly, the micro stereo structure 331 of the micro stereo structure layer 33 may be a hollow stereo structure having a rectangular section as shown in is FIG. 3A, and may also be a solid stereo structure having a rectangular section as shown in FIG. 3B; may also be a hollow stereo structure having a pentagonal section as shown in FIG. 3C; may also be a solid stereo structure having a pentagonal section as shown in FIG. 3D; may also be a hollow stereo structure having a circular section as shown in FIG. 3E; may also be a solid stereo structure having a circular section as shown in FIG. 3F; may also be a hollow stereo structure having an elliptical section as shown in FIG. 3G; and may also be a solid stereo structure having an elliptical section as shown in FIG. 3H. Of course, in some another embodiments, when the section is a polygon, that is, it may also be a triangle or other polygons; or, the section of the micro stereo structure 331 may also be a hollow or a solid stereo structure of some irregular graph.

It is preferred that the range of a thickness of the substrate film layer is 10-250 μm; it is preferred that the range of a thickness of the micro stereo structure layer is 1-5 μm; and it is preferred that the range of a thickness of the hardening film layer is 10-100 μm.

The present disclosure further provides a method of manufacturing the abovementioned hardening film, which includes:

S1, providing a substrate film layer. Particularly, as mentioned above, the material of the substrate film layer usually select polyethylene terephthalate (PET), triacetyl cellulose (TAC) or polyimide (PI), and may also use polymethyl methacrylate (PMMA).

S2, forming a micro stereo structure layer on the substrate film layer. Particularly, a patterned micro stereo structure layer including a plurality of micro stereo structures can be formed by using a printing process or a photolithography process. The printing process may be, for example, a screen printing process or a coining process.

S3, forming a hardening film layer on the micro stereo structure layer. Particularly, the hardening film layer can be obtained through a coating process or a chemical vapor deposition process.

In conclusion, the hardening film provided in an embodiment of the present disclosure can maintain a good bending performance by disposing a micro stereo structure layer, in which a plurality of micro stereo structure are disposed, between the substrate film layer and the hardening film layer, so that micro stereo structure layer forms a pore shape between the substrate film layer and the hardening film layer, and the hardening film is applied in the flexible AMOLED display device, which definitely can satisfy the requirement of the bendable performance of the product. In addition, when being subjected to an external pressure, the micro stereo structures can scatter and transfer a pressure of depressing the hardening film layer towards respective directions, which enhances the anti-impact ability of the product, increases an overall surface hardness of the flexible display device and promotes the quality of the product.

It should be explained that the relationship terms, such as first and second, etc., in the present text are only used for distinguishing one entity or operation from another entity or operation without requiring or implying any actual relation or sequence existing between these entities or operations. Moreover, the term "include", "contain" or any other variant means covering a non-exclusive inclusion, so that the process, method, object or device including a series of factors not only includes those factors but also includes other factors that are not explicitly listed or further include inherent factors for this process, method, object or device. Where no more limitations are provided, the factors defined by the sentence "include one . . . " do not exclude additional identical factors existing in the process, method, object or device which includes the factors.

The above statements are only the specific embodiments of the present application, it should be pointed out that, to those ordinary skilled in the art, several improvements and polish can be made without departing from the principle of the present application, those improvements and polish should also be considered as the protection scope of the present application.

What is claimed is:

1. A hardening film comprising:
   a substrate film layer;
   a micro stereo structure layer disposed on the substrate film layer; and
   a hardening film layer coated on the micro stereo structure layer,
   wherein the micro stereo structure layer includes a plurality of micro stereo structures, and
   wherein the micro stereo structures are arranged within the micro stereo structure layer as a repeating pattern of a predetermined shape.

2. The hardening film of claim 1, wherein the micro stereo structure is a hollow stereo structure having a section of a polygonal, a circular, an elliptical or an irregular shape.

3. The hardening film of claim 1, wherein the micro stereo structure is a solid stereo structure having a section of a polygonal, a circular, an elliptical or an irregular shape.

4. The hardening film of claim 1, wherein a thickness of the micro stereo structure layer is 1-5 μm.

5. The hardening film of claim 1, wherein a material of the micro stereo structure layer is an optical resin.

6. The hardening film of claim 1, wherein a thickness of the substrate film layer is 10-250 μm, and a thickness of the hardening film layer is 10-100 μm.

* * * * *